Nov. 24, 1964 P. E. PEARSON, JR 3,158,758

SWITCH APPARATUS

Filed May 14, 1962

INVENTOR.
PAUL E. PEARSON JR.
BY
S. C. Yeaton
ATTORNEY

United States Patent Office 3,158,758

Patented Nov. 24, 1964

3,158,758
SWITCH APPARATUS

Paul E. Pearson, Jr., Scottsdale, Ariz., assignor to Sperry Rand Corporation, Great Neck, N.Y., a corporation of Delaware Filed May 14, 1962, Ser. No. 194,565
8 Claims. (Cl. 307—88.5)

Figure 1:
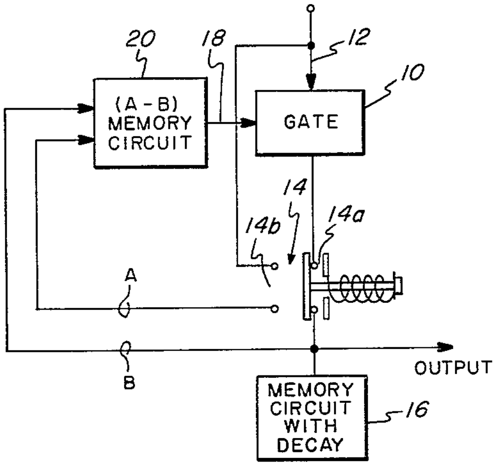

This invention relates to switches and in particular to a manually operated electronic switch which is of a type that opens and closes each successive actuation thereof. Specifically, a circuit embodying the invention conducts an applied signal continually therethrough when its switch is actuated; actuation of the switch again causes the circuit to block continually its applied signal, i.e. until the switch is again actuated. Should the applied signal be interrupted, the circuit immediately opens, such function being desirable in many applications, e.g. in equpment capable of either automatic or manual operation it is often desirable to disable the "automatic mode" for any interruption of power, this being to prevent intermittent "automatic" operation of the equipment.

In form, the switch circuit of the present invention has a gate circuit to which power is adapted to be applied continually, and which is adapted to be opened, i.e. made electrically conductive, on application thereto of a signal level. The gate circuit must be of the type which, once opened to conduct, remains open and conducting so long as the signal passing therethrough is uninterrupted. The gate circuit output signal is applied serially through a normally closed switch which, when opened, causes a signal level (representing the difference between the gate circuit input and output signals) to be applied to the gate circuit. Since the gate circuit has no output signal immediately after the switch is actuated, i.e. the series-connected switch interrupts the signal passing through the gate circuit, a memory device is provided to store the instantaneous output signal from the gate circuit. Theerfore, when the memory device stores no signal, actuation of the switch causes an appreciable difference signal level to be applied to the gate circuit (gating it open and into conduction when the switch is released); actuation of the switch now closes the gate circuit thereby preventing it from conducting, and in addition causes the difference signal level to be zero (i.e. the gate circuit input and memorized output signals are equal), the result being that when the switch releases the gate circuit remains closed and in a state of nonconduction.

To provide a switch circuit having the aforedescribed properties use is customarily made of electromagnetic components such as relays, these being fairly susceptible to failure; however, by means of the present invention semiconductor and other highly reliable components (which may be packaged more easily and smaller) are practical.

A principal object of the invention is to provide an electronic switch of a type that opens and closes each successive actuation thereof.

Another object of the invention is to provide an electronic switch adapted to have power continually applied thereto and which, on actuation, opens and remains so until its next actuation, or until there is an interruption of the applied power.

Figure 2:
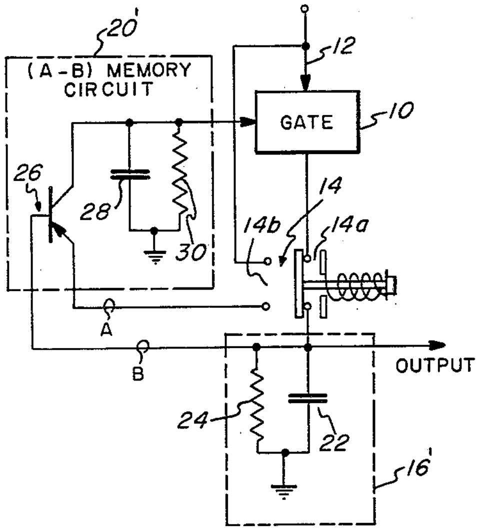
Figure 3:
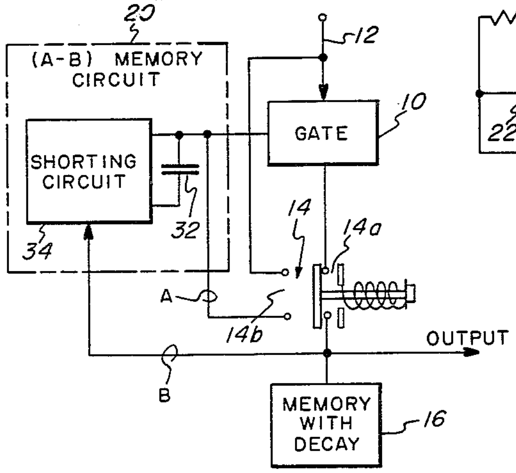
Figure 4:
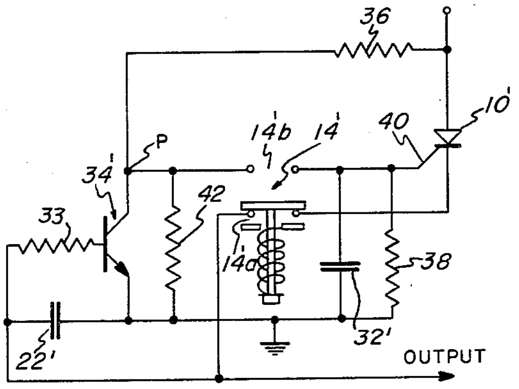

The invention will be described with reference to the figures wherein:

FIG. 1 is a block diagram depicting generally apparatus employing the invention, FIG. 2 is a schematic diagram of a form of the invention, FIG. 3 is a block diagram of another form of the invention, and FIG. 4 shows schematically a form of the apparatus of FIG. 3.

Referring to FIG. 1, a gate circuit 10 adapted to have a power signal applied continually to it from a lead 12 has its output applied through a switch 14 to a memory circuit 16, the memory circuit 16 being such as to permit its stored signal to decay with respect to time. The gate circuit 10 is adapted to be opened to conduct by a signal level appearing on a lead 18 when the following two conditions are met: (1) the switch 14 is in the position shown and (2) the lead 12 has a power signal thereon. (A gate circuit capable of operating in this manner is shown later in connection with FIG. 4.) The switch 14 is adapted to be held in the position shown, i.e. against contacts 14*a*, by a spring and applies the power signal on the lead 12 to a memory circuit 20 when the switch 14 is moved to short-circuit the switch contacts 14*b*. The memory circuit 16 also applies its stored signal, i.e. the signal representative of the gate 10 output, to the memory circuit 20 to cause that circuit to store a signal representing the difference between its two applied signals.

In describing the operation of the circuit of FIG. 1, the gate circuit 10 is assumed closed initially, i.e. not conducting, and the memory circuits 16 and 20 are assumed devoid of stored signals: When the switch 14 is actuated to short-circuit the contacts 14*b*, a signal is applied to the lead A connected to the memory circuit 20; since no signal appears on the lead B at this time, the memory circuit 20 now stores an appreciable signal (A–B). At the instant the switch 14 is released, the gate circuit 10 opens (i.e. the gate circuit 10 has power applied thereto, the switch 14 short-circuits its contacts 14*a* and the lead 18 has a certain signal level thereon), thereby causing power to be applied from the lead 12 to the output of the circuit. At the same time, a signal representative of the power output is stored in the memory circuit 16, this signal by being applied also to the memory circuit 20 causes the output signal (A–B) from that circuit to extinguish, i.e. $A=B$.

Actuation of the switch 14 again now closes the gate circuit 10 rendering it nonconductive, i.e. the signal flow through the gate is interrupted; on release of the switch 14 the gate circuit 10 remains closed, this being because the memory circuit 20 at this time has no output signal level, i.e. when the switch 14 short-circuited the contacts 14*b* the signal stored in the memory circuit 16 equaled the signal A on the lead 12. Because the signal stored by the memory circuit 16 decays with time, the aforementioned initial conditions are gradually restored, i.e. the gate circuit 10 is closed and nonconductive, and neither the memory circuit 16 nor the circuit 20 store signals. Therefore, the whole ON-OFF operation may be repeated again. By holding the switch 14 against the contacts 14*b* for a certain time period, i.e. long enough for the memory circuit 16 signal to decay appreciably, the memory circuit 20 is assured of an output signal level to open the gate circuit 10 and thereby make it conductive, this being even though that circuit had previously been open and conducting.

Referring now to FIG. 2, the memory circuits of FIG. 1 are shown taking special forms. (See components 16' and 20'.) The power signal passing through the switch 14 (when the gate circuit 10 is open and conducting) is applied simultaneously across a capacitor 22 and a resistor 24, and to the base of a P.N.P. type transistor 26. When the switch 14 is actuated to short-circuit the contacts 14*b*, the lead 12 signal is applied to the emitter of the transistor 26, the output signal of which is applied to the gate 10 and across a capacitor 28 and a resistor 30.

With the aforementioned initial conditions, the operation of the circuit of FIG. 2 will now be described: When the switch 14 is actuated to short-circuit the contacts 14*b*, the transistor emitter-base circuit is so biased as to cause the collector circuit to conduct; instantly, the capacitor 28 charges to store the signal on the lead 12, i.e. the signal A. When the switch 14 is released to short-circuit the contacts 14*a*, the gate circuit 10 opens to conduct, i.e. an appreciable signal level (signal A) and power from the lead 12 are applied to the gate 10 simultaneously with the short-circuiting of the contacts 14*a*. With the gate 10 open and conducting, the capacitor 22 charges to store a signal representative of the power signal, i.e. the signal B, such signal being applied also to the base of the transistor 26 to turn it off. The signal A stored by the capacitor 28 then decays through the resistor 30; however, the signal B stored by the capacitor 22 does not decay because the gate circuit 10 output keeps the capacitor 22 continually charged.

Actuation of the switch 14 to short-circuit the contacts 14*b* now causes the lead 12 signal A to be applied to the transistor 26 emitter simultaneously with the capacitor 22 signal being applied to transistor 26 base; therefore the emitter-base bias is zero and the transistor 26 collector circuit draws no current, i. e. the capacitor 28 (which had previously discharged) remains discharged. On release of the switch 14, the gate circuit 10, being closed and nonconductive by the instant actuation of the switch 14, remains closed and nonconductive since no signal is applied to the gate circuit 10 from the memory circuit 20′. With the gate circuit 10 closed and nonconducting, the signal B on the capacitor 22 gradually bleeds off through the resistor 24, being restored only by the next actuation of the switch 14. By holding the switch 14 against the contacts 14*b* for an appreciable time, i.e. long enough for the capacitor 22 to discharge, the gate circuit 10 will open to conduct (even though it had previously been opened and conductive).

In FIG. 3 still a different form of memory circuit 20 is provided, viz. the circuit 20″ which includes a capacitor 32 and a shorting circuit 34. On actuation of the switch 14 (assuming the aforementioned initial conditions), the lead 12 signal A is applied to and charges the capacitor 32; on release, the signal A is applied to the gate circuit 10 to open the gate and make it conduct. As a result, power is applied to the circuit output; at the same time the memory circuit 16 is made to store a representative signal (signal B) which, by being applied to the circuit 34, causes a short circuit to be created across the capacitor 32. Therefore, the signal A stored by the capacitor 32 dissipates through the shorting circuit 34. On actuation and release of the switch 14 again, the gate circuit 10 closes because no signal level is applied to the gate circuit from the capacitor 32 (this being true so long as the memory circuit 16 retains its signal for as long as the switch contacts 14*b* are short-circuited).

FIG. 4 shows the presently preferred form of the invention and embodies the specific teaching of FIG. 3. A controlled rectifier 10′ serving as the gate circuit (described above with reference to FIGS. 1, 2 and 3) is adapted to receive the power signal at its anode, its cathode being connected through a switch 14′ to the circuit output. Controlled rectifiers are described widely in the literature as exemplified by "Transistor Circuit Analysis," Joyce and Clarke, Addison Wesley Publishing Company, Reading, Mass., Library of Congress Catalog No. 61–5307. A capacitor 32′ adapted to store a signal A′ when the switch 14′ short-circuits the contacts 14′*b*, applies such signal to the gating electrode 40 of the rectifier 10′. The signal A′ is applied through a large resistor 36 and across a resistor 38, the latter resistor being in parallel with the capacitor 32′. The rectifier 10′ cathode signal, aside from being applied to the circuit output, is applied across a capacitor 22′ and through a bias resistor 33 to the base of an N.P.N. type transistor 34′, such transistor constituting the shorting circuit described in connection with FIG. 3. The signal adapted to be impressed across the capacitor 32′ is applied continually to the collector of the transistor 34′ and across a resistor 42.

Assuming initial conditions wherein the capacitors 22′ and 32′ are devoid of charges, the operation of the circuit of FIG. 4 will now be described: Actuation of the switch 14′ to short-circuit its contacts 14*b*, causes a voltage (signal A′) to develop across the resistor 42 and across the capacitor 32′; on release, the capacitor 32′ starts to discharge through the gating electrode-cathode circuit of the control rectifier 10′ and causes such rectifier to be gated ON and into conduction, the power signal appearing at the controlled rectifier anode being applied through to the circuit output and simultaneously stored across the capacitor 22′. Since the capacitor 22′ continually stores a signal representing the rectifier output signal (i.e. it remains charged continually) the transistor 34′ emitter-base circuit becomes biased to cause its emitter-collector circuit to conduct, thereby effectively creating a short-circuit across the resistor 42, causing the point P to become effectively grounded, and preventing the capacitor 32′ from being able to store a signal A′.

On actuation of the switch 14′ again, the anode-cathode circuit of the rectifier 10′ opens, causing the rectifier 10′ gate to close and stop conducting. However, since the point P is grounded, the capacitor 32′ does not charge at this time, this being true so long as the signal stored across the capacitor 22′ maintains the transistor 34′ emitter-collector circuit conducting, i.e. the capacitor 22′ must be sufficiently large to hold its charge while the switch contacts 14′*b* are short-circuited. With no signal stored across the capacitor 32′, release of the switch 14′ to short-circuit the contacts 14′*a* applies no gating signal to the rectifier 10′ and, since the rectifier gate was already closed and nonconducting (by switch 14′ actuation) it remains closed and nonconducting.

The resistor 38 is provided so that the signal A′ which previously opened the rectifier 10′ gate can decay; otherwise the capacitor 32′ would be permanently charged and the rectifier gate 10′ would be prevented from ever being closed and made nonconducting. So long as the capacitor 22′ discharges through the transistor 34′ base-emitter circuit, the transistor 34′ has collector current and the point P is held at ground potential. Therefore, by holding the switch 14′ against its contacts 14′*b* for a time longer than necessary to discharge the capacitor 22′, the capacitor 32′ will again charge to store the signal A′ and thereby permit the gate 10′ to open and conduct, regardless of whether the rectifier gate 10′ had previously been opened or closed.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. An electronic switch comprising circuit means for passing an applied signal continuously after application thereto of a certain signal level and until the conduction of said signal through said circuit means is interrupted, means for producing and applying to said circuit means a signal level proportional to the difference between two signals applied thereto, means for storing for a predetermined time a signal representative of the instantaneous output signal from said circuit means, switch means for applying on actuation a signal representative of the input signal to said circuit means to said means for producing a signal level, said switch means being connected to a closed series circuit with said circuit means only when not actuated, said means for producing a signal level receiving continually the signal stored by said signal storing means producing a signal level representing the difference between the stored signal subtracted from the signal representative of the input signal to said circuit means.

2. An electronic switch circuit comprising mechanical switch means having a normal rest position and a second position, means after said switch means is moved to its second position and released for returning said switch means to the rest position, gate circuit means serially connected with said switch means and adapted to be opened on simultaneous application thereto of an applied signal and a certain signal level, said gate circuit means remaining open so long as the signal passing therethrough is not interrupted, means for producing a signal level representative of the difference between two signals applied thereto, said signal level being applied to said gate circuit means, means for storing for a predetermined time a signal representative of the instantaneous output signal from said gate circuit means, said stored signal being applied continually to said means for producing a signal level, said switch means being connected to apply a signal representative of the input signal to said gate circuit means to said means for producing a signal level when said switch means is in said second position, whereby said means for producing a signal level produces a signal level representative of the difference between the stored signal subtracted from the signal representative of the gate circuit means input signal.

3. An electronic switch comprising circuit means for passing an applied signal continuously after application thereto of a certain signal level and until the conduction of said signal through said circuit means is interrupted, first means for storing for a predetermined time interval a signal representative of the instantaneous output signal from said circuit means, switch means connected to form a closed series circuit with said circuit means only when not actuated, second means for storing a signal for a predetermined time interval, third means connected to receive when said switch means is actuated a signal representative of the circuit means input signal for being driven thereby into conduction, said second means for being connected to receive and store a signal storing the output of said third means as a signal level and being connected further to apply such signal level to said circuit means, said third means being also connected to receive continually as a bias signal the signal stored by said first storage means, said bias signal being of such sense as will drive said third means out of conduction.

4. An electronic switch circuit comprising mechanical switch means having a normal rest position and a second position, means after said switch means is moved to its second position and released for said switch means to the rest position, gate circuit means serially connected with said switch means and adapted to be opened on simultaneous application thereto of an applied signal and a certain signal level, said gate circuit means remaining open so long as the signal passing therethrough is not interrupted, first means connected to receive and store for a predetermined time a signal representative of the instantaneous output signal from said gate circuit means, second storage means for storing a signal level for a predetermined time interval, and third means connected to receive and be driven thereby into conduction when said switch means is actuated a signal representative of the signal applied to the gate circuit, said second storage means being connected to receive and store as a signal level the output from said third means, being connected further to apply such stored signal level to said gate circuit, said third means also being connected to receive the signal stored by said first storage means as a bias signal, said bias signal being of such sense as will drive said third means out of conduction.

5. An electronic switch comprising circuit means for passing an applied signal continuously after application thereto of a certain signal level but only so long as the conduction of said signal through said circuit means is not interrupted, first means connected to receive and store for a predetermined time interval a signal representative of the instantaneous output signal from said circuit means, switch means connected to a closed series circuit with said circuit means only when not actuated, second means for storing a signal for a predetermined time interval, means in parallel with said second means for storing a signal connected to receive the signal stored by said first means and produce in response thereto a short-circuit across said second signal storing means when the signal received from said first signal storing means exceeds a certain level, said second signal storing means being applied connected to apply its stored signal continually to said circuit means.

6. An electronic switch circuit comprising mechanical switch means having a normal rest position and a second position, means after said switch means is moved to its second position and released for returning said switch means to the rest position, gate circuit means serially connected with said switch means and adapted to be opened on simultaneous application thereto of an applied signal and a certain signal level, said gate circuit means remaining open so long as the signal pasing therethrough is not interrupted, first means connected to receive and store for a predetermined time a signal representative of the instantaneous output signal from said gate circuit means, second means for storing a signal for a predetermined time interval connected to receive when said switch means is in its second position a signal representative of the gate circuit input signal, means connected to receive the signals stored by both said first and second means and produce therefrom a difference signal in the form of a signal level, and means applying said signal level to said gate circuit means.

7. An electronic switch circuit comprising a controlled rectifier having an anode, a cathode and a gating electrode, said rectifier being forwardly biased by a signal adapted to be connected therethrough, switch means forming a closed circuit in series with the anode-cathode circuit of said rectifier when in a first normal rest position and forming, when in a second position, a closed circuit in series with the gating electrode of said rectifier, first capacitance means in parallel with said gating electrode adapted to store, when said switch means is in its second position, a signal representative of the signal adapted to be conducted through said controlled rectifier, first load means having the signal adapted to be applied to said first capacitance means continually applied across it, second load means in parallel with said first capacitance means when said switch means is in said second position, second capacitance means in parallel with the switch circuit output continually storing for a predetermined time the circuit output signal, and means in parallel with said first load means continually receiving the signal stored by said second capacitance means adapted to short-circuit said first load means when the signal stored by the second capacitance means is at least as great as the signal applied across the first load means.

8. An electronic switch circuit comprising a controlled rectifier having an anode, a cathode and a gating electrode, said rectifier being forwardly biased by a signal adapted to be conducted therethrough, switch means forming a closed circuit in series with the anode-cathode circuit of said rectifier when in a first normal rest position and forming, when in a second position, a closed circuit in series with the gating electrode of said rectifier, first capacitance means in parallel with said gating electrode adapted to store, when said switch means is in its second position, a signal representative of the signal adapted to be conducted through said controlled rectifier, first load means having the signal adapted to be applied to said first capacitance means continually applied across it, second load means in parallel with said first capacitance means when said switch means is in said second position, second capacitance means in parallel with the switch circuit output continually storing for a predetermined time the circuit output signal, and amplifier means in parallel with said first load means continually receiving as a bias signal the signal stored by said second capacitance means, whereby said amplifier means is driven into conduction when the ratio of the signal developed across said first load means to the signal stored by said second capacitance means exceeds a predetermined value.

References Cited in the file of this patent

"Silicon Controlled Rectifier," page 54, December 1958.